United States Patent
Bhaskaran et al.

(10) Patent No.: US 10,884,267 B2
(45) Date of Patent: Jan. 5, 2021

(54) PHASE CHANGE MATERIAL-BASED DISPLAY DEVICE WITH RESISTIVE SWITCHING ELEMENTS

(71) Applicant: BODLE TECHNOLOGIES LTD, Oxford (GB)

(72) Inventors: Harish Bhaskaran, Oxford (GB); Peiman Hosseini, Bicester (GB); Ben Broughton, Oxford (GB)

(73) Assignee: BODLE TECHNOLOGIES LTD, Oxford (GB)

( * ) Notice: Subject to any disclaimer, the term of this patent is extended or adjusted under 35 U.S.C. 154(b) by 173 days.

(21) Appl. No.: 16/334,653

(22) PCT Filed: Sep. 5, 2017

(86) PCT No.: PCT/EP2017/072242
§ 371 (c)(1),
(2) Date: Mar. 19, 2019

(87) PCT Pub. No.: WO2018/054683
PCT Pub. Date: Mar. 29, 2018

(65) Prior Publication Data
US 2020/0133033 A1 Apr. 30, 2020

(30) Foreign Application Priority Data

Sep. 23, 2016 (EP) ..................................... 16002061

(51) Int. Cl.
*G02F 1/01* (2006.01)
(52) U.S. Cl.
CPC .......... *G02F 1/0147* (2013.01); *G02F 1/0121* (2013.01)
(58) Field of Classification Search
CPC .......... G02F 1/0147; G02F 1/132; E06B 9/24; B32B 17/10; B82Y 20/00

(Continued)

(56) References Cited

U.S. PATENT DOCUMENTS 3,021,387 A 2/1962 Rajchman
5,212,573 A 5/1993 Yamazaki
(Continued)

FOREIGN PATENT DOCUMENTS

CN 105849626 A 8/2016
WO WO 2015/097468 7/2015

OTHER PUBLICATIONS

International Preliminary Report on Patentability for International Application No. PCT/EP2017/072242, dated Apr. 4, 2019.
(Continued)

*Primary Examiner* — Mohammed A Hasan
(74) *Attorney, Agent, or Firm* — Jason H. Vick; Sheridan Ross, PC

(57) ABSTRACT

The present invention is notably directed to display device (1, 1*a d*), comprising a set of pixels, each having a layer structure (2, 2*c*, 2*d*) that includes: a bi-stable, phase change material (10), or bi-stable PCM, having at least two reversibly switchable states, in which the PCM exhibits two different values of refractive index and/or optical absorption; and a heating element (17, 17*c*, 17*d*), electrically insulated from the PCM (10) and in thermal communication with the PCM (10) in the layer structure (2, 2*c*, 2*d*). The display device further comprises a set of nonlinear, monostable resistive switching elements (21), each in electrical communication with the heating element (17, 17*c*, 17*d*) of one of the pixels. The resistive switching elements are designed so as to exhibit, each: a low resistance, unstable state, which allows the heating element (17, 17*c*, 17*d*) to be energized via the resistive switching element (21), so as to heat the PCM (10) and reversibly change a refractive index and/or an optical absorption thereof, in operation; and a high-resistance, stable state, which allows leakage currents to be mitigated, so as to prevent inadvertent switching of the PCM (10) from one of its states to the other, in operation. The (Continued)

device further comprises a controller (30) configured to energize any of the pixels via a respective one of the resistive switching elements (21), so as to switch the latter from its high-resistance state to its low resistance state, in order to energize a respective heating element (17, 17*c*, 17*d*) and, in turn, reversibly change a refractive index and/or an optical absorption of a respective PCM (10). The present invention is further directed to related devices or apparatuses, such as passive matrix addressing displays, and methods of operations.

15 Claims, 5 Drawing Sheets

(58) Field of Classification Search
USPC .......................................................... 359/288
See application file for complete search history.

(56) References Cited

U.S. PATENT DOCUMENTS

2017/0031231 A1    2/2017  Bhaskaran et al.
2019/0064555 A1*   2/2019  Hosseini ............... G02F 1/0147

OTHER PUBLICATIONS

International Search Report for International Application No. PCT/EP2017/072242, dated Nov. 13, 2017.
Written Opinion for International Application No. PCT/EP2017/072242, dated Nov. 13, 2017.

* cited by examiner

PHASE CHANGE MATERIAL-BASED DISPLAY DEVICE WITH RESISTIVE SWITCHING ELEMENTS

CROSS REFERENCE TO RELATED APPLICATIONS

This application is a national stage application under 35 U.S.C. 371 of PCT Application No. PCT/EP2017/072242, having an international filing date of 5 Sep. 2017, which designated the United States, which PCT application claimed the benefit of European Patent Application No. 16002061.6 filed 23 Sep. 2016, the contents of each of which are incorporated herein by reference in their entirety.

BACKGROUND

The invention relates in general to the field of display devices based on bi-stable, phase change materials (or bi-stable PCMs), and in particular to passive matrix addressing, PCM-based display devices.

There has been considerable research into phase change material (PCM) technology and its use in optoelectronic devices such as ultra-high resolution reflective displays, see-through displays, and force sensors. PCMs include materials that can be electrically switched between more than one phases, which have different optoelectronic properties. Bi-stable PCMs are particularly attractive because after a phase transition has been completed it is not necessary to continuously apply power to maintain the device in its current state.

Displays in general can be classified as passive matrix (PM) and active matrix (AM) displays, depending on how the display is addressed. Generally speaking, AM displays have better efficiency and longer lifetime than PM displays, but higher product cost. The high cost of AM displays comes mainly from the required thin film transistor (TFT) backplane. Due to some limitations inherent to the materials, the TFT backplanes are expensive to make PM displays are less expensive than AM displays. However, the performance of PM displays is usually less satisfactory: PM displays generally have a shorter lifetime, limited resolution and size, and are less power efficient.

It would be of considerable interest to be able to fabricate a low-cost, PCM-based PM display with acceptable performance There are, however, challenges to the proper functioning of such displays, as present Inventors have realized.

SUMMARY

According to a first aspect, the present invention is embodied as a display device. The latter comprises a set of pixels that have, each, a layer structure that includes: a bi-stable, phase change material, or bi-stable PCM; and a heating element. The bi-stable PCM has at least two reversibly switchable states, in which the PCM exhibits two different values of refractive index and/or optical absorption. The heating element is electrically insulated from the PCM and in thermal communication with the PCM in the layer structure. The display device further comprises a set of nonlinear, monostable resistive switching elements, which may possibly form part of the pixels. The resistive switching elements are, each, in electrical communication with the heating element of one of the pixels. They are designed so as to exhibit a low resistance, unstable state and a high-resistance, stable state. The low resistance state allows the heating element to be energized via the resistive switching element, so as to heat the PCM and reversibly change a refractive index and/or an optical absorption thereof, in operation. The high-resistance state allows leakage currents to be mitigated, so as to prevent inadvertent switching of the PCM from one of its states to the other, in operation. Finally, the device further comprises a controller configured to energize any of the pixels via a respective one of the resistive switching elements, so as to switch the latter from its high-resistance state to its low resistance state, in order to energize a respective heating element and, in turn, reversibly change a refractive index and/or an absorption of a respective PCM.

The present devices make it possible to filter out parasitic currents or voltage signals, such as "sneak path" currents or leakage currents and the like, thanks to the resistive switching elements. This, in turn, prevents inadvertent switching of the PCM elements. This solution is particularly beneficial for passive matrix addressing displays.

The present display devices are, accordingly, preferably embodied as passive matrix addressing displays. Such display devices further comprise an arrangement of pairs of electrodes, wherein each of the pairs of electrodes is in electrical communication with a heating element of one of the pixels, via a respective one of the resistive switching elements that is connected in series between the electrodes of said each of the pairs, so as for each of the pixels to be individually addressable by the controller in the display device.

Preferably, each of the pixels comprises a respective one of the resistive switching elements, the latter stacked in the layer structure of said each of the pixels. This solution is particularly easy to fabricate.

In preferred embodiments, the arrangement of pairs of electrodes forms a matrix, whereby first electrodes of the pairs of electrodes are arranged in columns and second electrodes of the pairs of electrodes are arranged in rows. In case resistive switching elements are stacked in the layer structures of the pixels, each of the pixels may preferably be offset laterally, i.e., in a direction perpendicular to a stacking direction of the layer structure of the pixels, from a crosspoint formed at an intersection of one of the first electrodes with one of the second electrodes. The electrodes of each pair of electrodes are, each, in electrical communication with a resistive switching element of a pixel. The offset of the pixels gives rise to simple planar structures and avoids interferences with optical properties of the pixels that would else be caused by the electrodes if the layer stacks were sandwiched between electrodes, as in usual crosspoint configurations.

In other embodiments, each of the pairs of electrodes is in electrical communication with a heating element of one of the pixels through two vias, which extend, each, parallel to a stacking direction of the layer structure of the pixels. One of said vias comprises a resistive switching element, which is in electrical communication with the heating element of one of the pixels. This approach allows 3D structures, which make it possible to improve the density of pixels, compared, e.g., to offset structure as evoked above.

In particular embodiments, the vias both extend between an average plane of the arrangement of pairs of electrodes and an average plane of the heating elements of the pixels. The heating elements are preferably configured as an optical reflector.

In other particular embodiments, first electrodes of the pairs of electrodes extend in a first plane on one side of an average plane of the heating elements, and second electrodes of the pairs of electrodes extend in a second plane on another side of the average plane of the heating elements. One of said two vias is connected to one of said first electrodes, the other one of the vias being connected to one of the second electrodes. Again, the second electrodes may preferably be configured as optical reflectors.

In preferred embodiments, the layer structure of the pixels further comprises a thermally conducting, optical reflector and a thermally conducting spacer, which is transmissive to light and arranged above the reflector. The PCM is arranged above the spacer, so as for the reflector, the spacer and the PCM to be successively stacked along a stacking direction of the layer structure. The heating element is opposite to the PCM with respect to the reflector. The layer structure is otherwise configured so as for the heating element to be in thermal communication with the PCM via the reflector and the spacer. In this approach, the optically active element containing the PCM is separated from the heating element by an electrically insulating barrier, which is nevertheless thermally conducting. This, as present Inventors have realized, makes it possible to switch a large portion of the PCM, while preserving an ordered sequence of layers of the optically active substructure (namely PCM spacer reflector). The reversibly switchable states cause the PCM to exhibit two different values of refractive index and/or absorption, allowing a first degree of freedom in terms of optical properties (first optical function). Concurrently, the thickness of the spacer can be adjusted (or varied from one layer structure to the other), which enables a second degree of freedom in terms of optical properties (second optical function). Indeed, this makes it possible to exploit the fact that the reflectivity will vary significantly as a function of wavelengths of light, because of interference effects which are dependent on the (complex) refractive index of the PCM and the thickness of all the layers of the optical stack, including that of the PCM itself. As a result, optical properties of the device can be tuned thanks to the spacer (e.g., to confer a "colour" to a subpixel), without requiring additional filters. Thus, present devices can be designed so as to leverage two optical functions, while allowing a large portion of the PCM to be switched.

Particular embodiments offer additional advantages, notably in terms of switching (to favour a large area of switching) and optical properties. For instance, in embodiments, the average thickness of the reflector is between 50 nm and 1 µm, the average thickness of the spacer is between 10 nm and 250 nm, and the average thickness of the PCM is between 0.5 nm and 500 nm, preferably between 1 nm and 100 nm, and more preferably between 7 nm and 15 nm.

In embodiments, the average thickness of the heating element is between 20 nm and 2 µm, and preferably between 60 nm and 140 nm, while the average thickness of the resistive switching element is between 10 nm and 100 nm, and preferably between 10 nm and 30 nm.

Resistive switching elements as used herein may possibly be threshold switching devices, e.g., ovonic threshold switches, metalinsulator transition devices, diodes, or threshold vacuum switches. In embodiments, however, the resistive switching element is not a diode, for reasons that will become apparent later.

In preferred embodiments, each of the resistive switching elements comprises a material that is one of: an oxide; a nitride; a sulfide; an oxynitride; and diamond. It may for instance include one or more materials that comprise, each, one or more of: $NbO_x$, $VO_x$, $HfO_2$, $SiO_2$, $ZrO_2$, and $TiO_2$.

Preferably, the PCM comprises one or more of the following compounds: GeSbTe, VON, $NbO_x$, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb.

In embodiments, the heating elements comprise one or more of the following: NiCrSi, NiCr, W, TiW, Pt, Ta, Mo, Nb and Ir.

According to another aspect, the invention is embodied as a method for controlling a display device such as evoked above. Basically, this method comprises repeatedly energizing the pixels, via the controller, so as to reversibly switch resistive switching elements that are in electrical communication with respective heating elements of the pixels and energize the respective heating elements to reversibly change a refractive index and/or an optical absorption of respective PCMs of the pixels, consistently with principles evoked above.

Devices, systems and methods embodying the present invention will now be described, by way of non-limiting examples, and in reference to the accompanying drawings.

Figure 1:
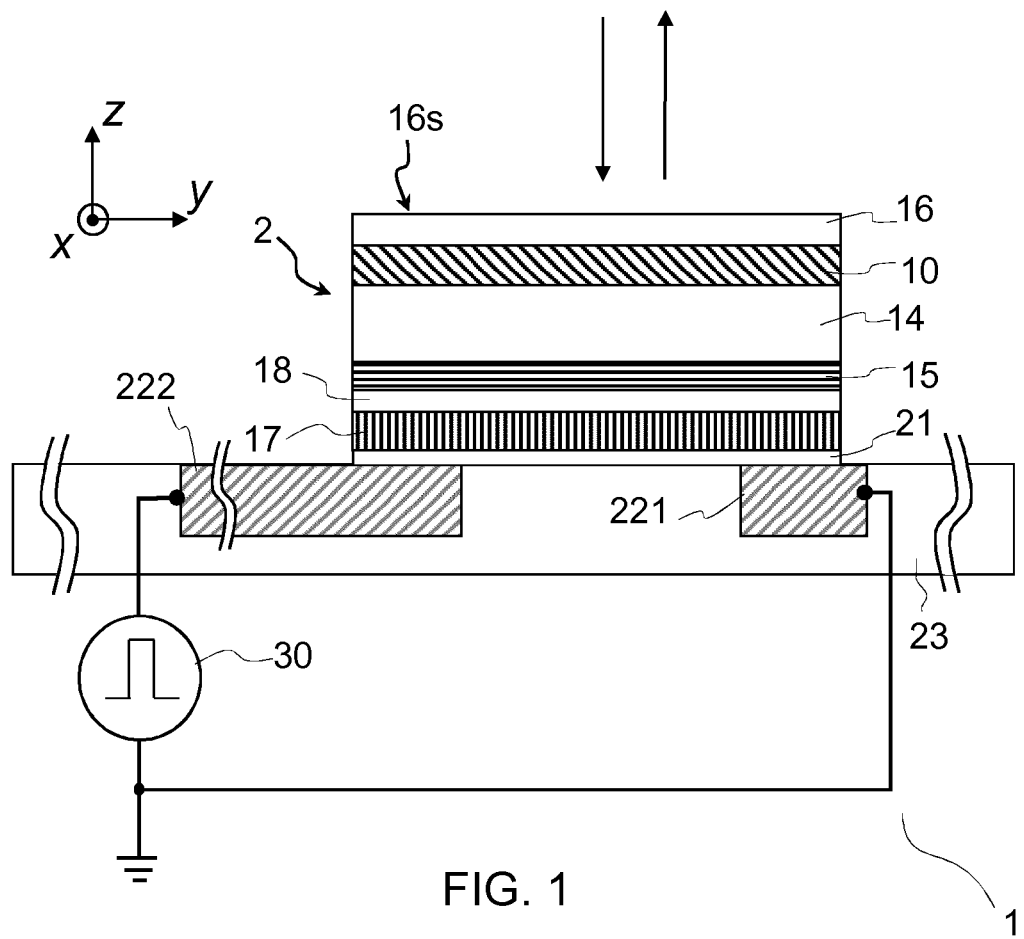
FIG. 1 shows a 2D cross-sectional view of a PCM pixel, in electrical communication with a controller, as involved in display devices according to embodiments.

The accompanying drawings show simplified representations of devices or parts thereof, as involved in embodiments. Technical features depicted in the drawings are not necessarily to scale. In particular, some dimensions or aspect ratios are exaggerated, for the sake of depiction. Similar or functionally similar elements in the figures have been allocated the same numeral references, unless otherwise indicated.

DETAILED DESCRIPTION OF EMBODIMENTS OF THE INVENTION

As present Inventors have observed, there are challenges to fabricating a passive matrix, PCM-based display due to the resistive nature of the PCM pixel actuation. Each PCM pixel is typically actuated by a resistive heater element and must be connected across junctions of intersecting crossbar electrodes of the matrix address structure. When the pixel heater is actuated by the crossbar address, current flows through the selected heater but other adjacent paths, or 'sneak paths', also exist between neighbouring elements. Consequently other pixels can happen to be actuated at the same time. In other words, unique passive matrix addresses will not function correctly.

As Inventors have further realized, this problem can be solved by inserting a (strong) nonlinearity in series in the current paths, to more selectively heat the heater and, in turn, switch the PCM. Yet, the current path and the thermal path can be made partly independent, so that a uniform switching of the PCM can be achieved, as explained later in detail. The nonlinear element allows access to well-selected pixels, without disturbing the other pixels or inducing wasteful leakage through the (thousands or millions of) other crosspoint intersections. The nonlinear element inserted suppresses the sneak current path through unselected pixels.

In reference to FIGS. 1, 4, 7-10, a general aspect of the invention is now described in detail, which concerns a display device 1, 1a d. The display device comprises a set of pixels that have, each, a layer structure 2, 2c, 2d.

This layer structure notably includes a bi-stable, phase change material 10 (hereafter referred to as a PCM). The PCM has at least two reversibly switchable states, in which it exhibits two different values of wavelength-dependent, complex refractive index (n+ik). For example, n or k may differ by at least 0.2, at least for some useful wavelengths of light as discussed below. The reversibly switchable states of the PCM may further exhibit distinct optical absorptions. The exemplary embodiments described below rely on two states of distinct refractive indices, for the sake illustration. Yet, it is understood that variants can be contemplated, in which the refractive index and/or the optical absorption of the PCM may change upon switching. PCMs as contemplated herein are reversibly switchable under application of a heat pulse. Such materials are known per se. Example of such materials are described later.

This layer structure further includes a heating element 17, 17c, 17d, which is electrically insulated from the PCM 10 but in thermal communication therewith, as per a configuration of the layer structure 2, 2c, 2d.

The display device further comprises a set of nonlinear, monostable resistive switching elements 21 (or RSEs, for short). As we shall see, a RSE may form part of the layer structure of a pixel, or not. In all cases, each RSE is in electrical communication with the heating element 17, 17c, 17d of one of the pixels.

Each of the RSEs is designed so as to exhibit two distinct states $R_1$, $R_2$. In the present context, a RSE means a nonlinear element, i.e., an element that has nonlinear current-voltage characteristics and can therefore be energized so as to reach a lower resistance state $R_2$ than its default, high-resistance state $R_1$ (i.e., the stable state). A low resistance (high conductivity) state of the RSE allows the heating element 17, 17c, 17d to be energized via the resistive switching element 21. This, in turn, makes it possible to heat the PCM 10 and reversibly change a refractive index thereof, in operation of the display device. On the contrary, a high-resistance state (low conductivity) of the RSE allows leakage currents or other parasitic signals to be mitigated, so as to prevent inadvertent switching of the PCM 10 from one of its states to the other, in operation. Although off currents may typically be an order of magnitude less than normal ON currents, they may well cause to alter the refractive index of the PCM and thus deteriorate the visual performance of the display.

The device further comprises a controller 30, to fire up pixels and enable display functions of the device. The pixels may be independently controlled, so as to be "all points" or pixel addressable. The controller is generally configured to energize any of the pixels via a respective RSE 21, so as to switch the latter from a high-resistance state to a low resistance state. This allows the controller to energize a respective heating element 17, 17c, 17d (i.e., the heating element of the pixel fired) and, in turn, to reversibly change a refractive index of a respective PCM 10. That is, energizing the heating element 17, 17c, 17d results in producing heat (typically by Joules heating), which, in turn, heats the PCM 10 and, provided sufficient heat is transmitted to the PCM, switches the latter, such that its refractive index can be changed. This change is reversible, inasmuch as the application of a subsequent signal by the controller will allow another heat pulse to reach the PCM, so as to switch the latter back to an initial state.

The controller 30 is typically configured to apply current or voltage signals that will first switch the RSE 21, for it to generate a current that will reach the heating element 17, 17c, 17d. The current reaching the heating element causes the latter to heat up and thereby switch the PCM. When the heating element is heated, heat is quickly transmitted to the PCM (e.g., via a reflector and spacer), so as to heat the PCM and thereby allow it to be switched from one state to the other.

As said, the PCM 10 is bi-stable, i.e., it exhibit two stable states of distinct refractive indices. This way, the PCM pixel can maintain its current state (until it is refreshed again), without it being needed for the control mechanism (e.g., a passive matrix) to maintain power, so as to maintain a current state of the PCM pixel. This accordingly saves power. There is, in addition, no need of a complex circuitry (e.g., a TFT backplane), which simplifies the design and fabrication of the display device and thus reduces its fabrication cost.

The PCM 10 is preferably on top of the heating element 17, 17c, 17d, which is itself on top of (e.g., in direct contact with) the RSE 21, for the sake of efficiency in the thermal and electrical communications required as per the present approach.

Contrary to the PCM, the RSE 21 is monostable, the high-resistance being the stable state. RSEs are known per se. Resistive switching refers to a physical phenomenon occurring in a material that suddenly changes its resistance under action of, e.g., a sufficient current or electric field, or any suitable form of localized heat. Several classes of switching materials, ranging from metal oxides to chalcogenides, have been proposed in the past. The performances of these materials are notably appreciated in terms of power consumption, integration density potential, and endurance.

A RSE as used herein has a nonlinear current-voltage characteristic, as described later in reference to FIG. 2. The change is not permanent as the RSE is monostable, i.e., the RSE spontaneously reverts back to its high-resistance (low conduction state) when the signal applied by the controller 30 ceases. Thus, the RSE need not be energized again to return to a high-resistance state, in which leakage currents are mitigated. Thus, using a RSE as described above prevents inadvertent switching of the PCM, while requiring little power and, this, without requiring any complex circuitry. The present approach is particularly interesting for passive matrix addressing displays, as discussed later in detail.

While, in principle, several energization schemes may be contemplated to switch the RSE 21, the latter is preferably switched by application of a voltage signal, i.e., a waveform-based voltage signal, having the amplitude necessary to switch the RSE. This control signal may actually comprise a sequence of pulses, e.g., voltage pulses, as known. Note that, in the present context, the same voltage signal as applied to switch the RSE 21 may advantageously cause to heat the heater and, in turn, switch the PCM, once a voltage setpoint of the RSE has been reached. I.e., there is no need to apply a subsequent signal to heat the heater. Thus the PCM can be switched even if the low-resistance state of the RSE has a relatively short duration, which simplifies the controller functions 36 and the multiplexing 31, 32, FIG. 3. If necessary, a function generator 34 is relied on to generate suitable signals. Similarly, a single signal may be used to switch the PCM back to an initial state. E.g., the RSE is energized again so as to cause a distinct heat pulse and switch the PCM back.

In variants, one or more pulses may need be applied to achieve an equivalent result. In all cases, voltage pulses are preferred over currents as it is often more difficult to source currents in devices of interest here, in practice. Yet, current pulse control may provide improved performance in operation of the display in some cases (e.g., faster switching, lower power, etc.) and the controller may be configured to provide these.

Figure 2:
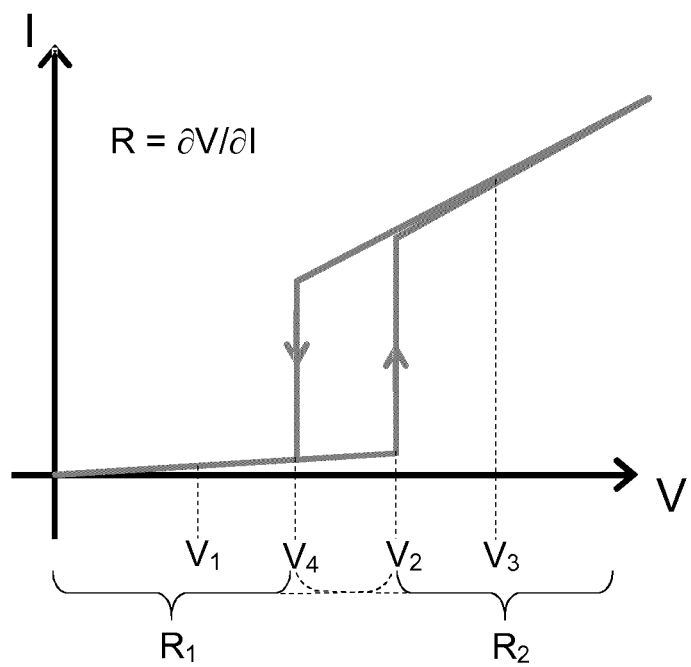
FIG. 2 is a plot that schematically illustrates current-voltage characteristic of a nonlinear resistive switching element, as involved in embodiments.

The current-voltage diagram represented in FIG. 2 is just a model indicative of the nonlinear characteristics that the RSE should have. A real device may, of course, exhibit more or less pronounced inflexions (about $V_2$ and $V_4$) and hysteresis loop, its actual resistance R being defined as the derivative $R=\partial V/\partial I$, i.e., the inverse of the slope in FIG. 2. Yet, the nonlinear characteristics of the RSE reveal two distinct states $R_1$, $R_2$, determined by inflexion points (about $V_2$ and $V_4$). When the RSE is energized (on the way up, i.e., upward along the hysteresis), it maintains a state $R_1$ in which the RSE has high resistances, until a certain threshold voltage $V_2$ is achieved. Once the applied voltage (e.g., $V_3$ in FIG. 2) exceeds $V_2$, the RSE can be said to be in state $R_2$ where it exhibits substantially lower resistances than in its previous state $R_1$. It will stay in state $R_2$ until the voltage applied is decreased. On the way down (downward along the hysteresis), once the applied voltage falls below $V_4$ (e.g., no signal is applied anymore) the RSE returns into a state $R_1$ of higher resistance. Because the slope of the curve depicted in FIG. 2 is substantially higher (but roughly constant) beyond $V_2$ (or before $V_4$ on the way down) the resistance $R_2$ is substantially lower than $R_1$.

Various types of RSEs may be relied on, which have suitable nonlinear characteristics. For instance, the RSEs 21 may be designed as threshold switching devices, e.g., as ovonic threshold switches, metalinsulator transition devices, diodes (e.g., thin-film, planar, etc.), or a threshold vacuum switches.

The present RSEs 21 will typically comprise an oxide, a nitride, a sulfide, an oxynitride and/or diamond. For example, a RSE may comprise one or more materials that comprise, each, one or more of the following compounds: $NbO_x$, VON, $HfO_2$, $SiO_2$, $ZrO_2$, and $TiO_2$.

Using such materials, the average thickness of the RSE 21 is preferably between 10 nm and 100 nm, and more preferably between 10 nm and 30 nm.

While diodes may indeed be contemplated for the present purpose, the use of diodes may, however, cause additional issues. First, using diodes may cause additional complexity, as diodes require multiple layers of n- and p-type materials, whereas a nonlinear selector can be made of uniform material. In addition, diodes are difficult to downscale to submicron sizes without losing in performance. Finally, PCM devices need amounts of currents for which thin film diodes quickly deteriorate. Thus, the RSE 21 is preferably not a diode; it may rather be made of a single, uniform material.

Preferred PCMs comprise one of the following compounds: GeSbTe, $VO_x$, $NbO_x$, GeTe, GeSb, GaSb, AgIn-SbTe, InSb, InSbTe, InSe, SbTe, TeGeSbS, AgSbSe, SbSe, GeSbMnSn, AgSbTe, AuSbTe, and AlSb. Yet, other materials may be contemplated, which comprise chemical combinations of elements cited in the above compounds. In particular, the PCM may be a compound or an alloy of a combination of such elements, namely selected amongst Ag, Al, Au, Ga, Ge, In, Mn, Nb, O, S, Sb, Se, Sn, Te, and V. It is understood that various stoichiometric forms of the above materials may be contemplated. For example, $Ge_xSb_yTe_z$ may be used and, in particular, $Ge_2Sb_2Te_5$ (also known as GST). In other embodiments, a suitable material may be $Ag_3In_4Sb_{76}Te_{17}$ (also known as AIST). Using such materials, the average thickness of the PCM 10 will typically be between 0.5 nm and 500 nm, and preferably between 1 nm and 100 nm.

Preferred PCMs are those that favour uniform (bulk) switching, i.e., involving a large portion of material in the switching process, as opposed to filamentary switching. Note that the formation of multiple (parallel) filaments may eventually amount to a bulk switching and convene as well. Yet, if the thickness of the PCM is too high, it may not ensure a proper switching, hence the need to restrict the thickness of the PCM layer, as exemplified later.

For embodiments relying on PCM's states of distinct refractive indices, a difference of at least 0.2 over at least part of the visible wavelength range is typically needed for the refractive indices of the two states of the PCM. For example, one may have n=2.4 in the high refractive index state and n=1.6 in the low refractive index state. The difference of refraction indices in the two states will typically range from 0.2 to 4. Typical values of refractive indices and extinction coefficients for typical PCMs can for instance be found can be found in "WHP Pernice and H. Bhaskaran, Photonic non-volatile memories using phase change materials, Applied Physics Letters, 101, 011243 2012". The profile of temperatures that can be reached in the PCM may typically be in the range of 500-600° C. for GST, or even higher (>600° C.). The switching temperature is material dependent, and not all materials switch at the same temperatures.

The heating elements 17, 17c, 17d may for instance include a metal or metal alloy that has high resistivity and thermal conductivity. For example, the heating elements may be formed from one or more of the following: NiCrSi, NiCr, W, TiW, Pt, Ta, Mo, Nb and Ir. Other materials may, however, be contemplated, such as TiN, TaN, or a combination of similar metals or metal alloys. In other variants, the heating elements may comprise ITO or other transparent, resistive materials, e.g., for use in transparent or transmissive displays. The heating element normally has a melting temperature that is higher than the melting temperature of the PCM 10, to enable necessary heat pulses. The average thickness of the heating element 17, 17c, 17d is preferably between 20 nm and 2 µm, and more preferably between 60 nm and 140 nm.

Referring now altogether to FIGS. 3, 4, 7-10, the present display devices may advantageously be embodied as a passive matrix addressing display 1a-1d. Such a display typically comprises an arrangement of pairs of electrodes 221, 222, which forms a matrix, whereby first electrodes 221 are arranged in columns and second electrodes 222 are arranged in rows. In the present context, each pair of electrodes need be in electrical communication with a heating element 17, 17c, 17d of one of the pixels 2, 2c, 2d, via a respective RSE 21. This RSE is connected in series between the electrodes 221, 222 of each pair. This way, each of the pixels 2, 2c, 2d is easily addressable, individually, by the controller 30 in the display device. The RSEs filter out unwanted currents, without it being needed to involve complex circuitry.

The pixels are typically arranged in column and row lines and form an array, to form an imaging area of the display. Typically, the matrix addressing scheme requires the controller to be able to independently apply m+n control signals to address a display of m×n pixels.

Figure 3:
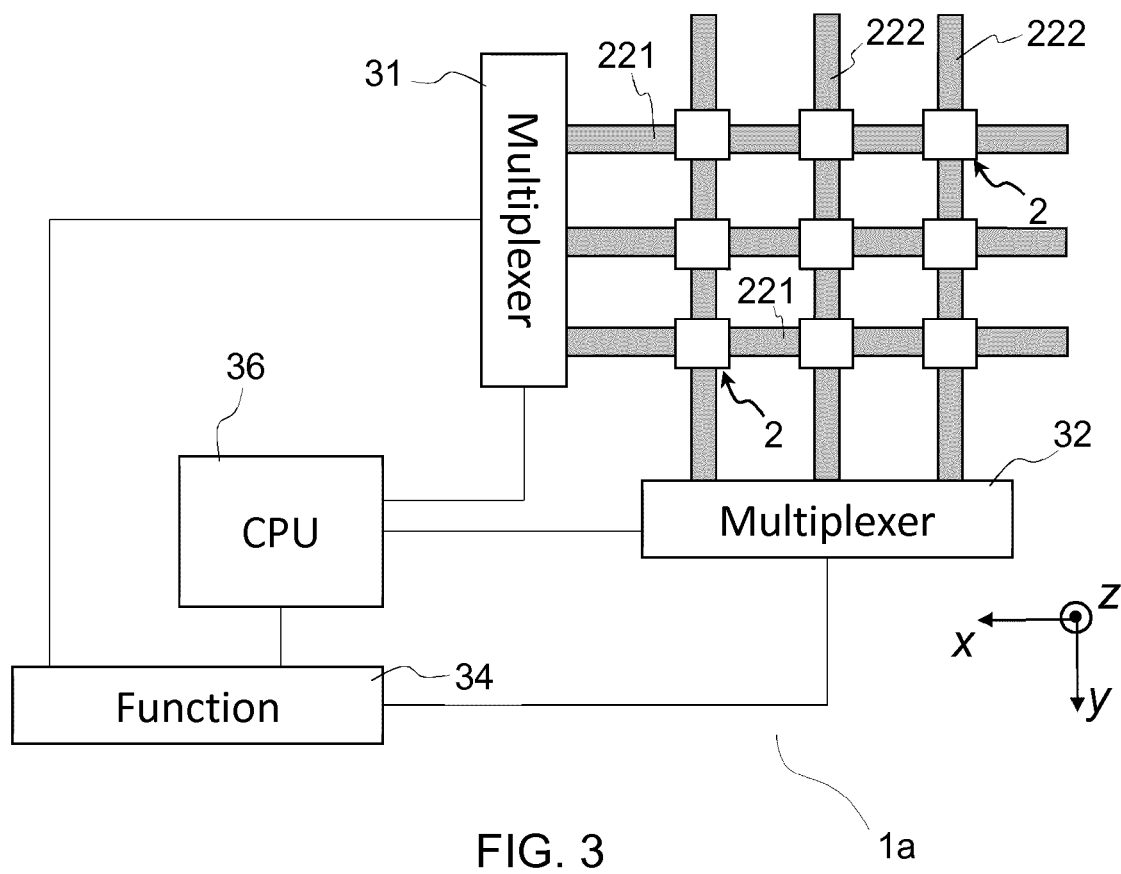
FIG. 3 is a schematic diagram of passive matrix PCM display, at system level, according to embodiments.
Figure 4:
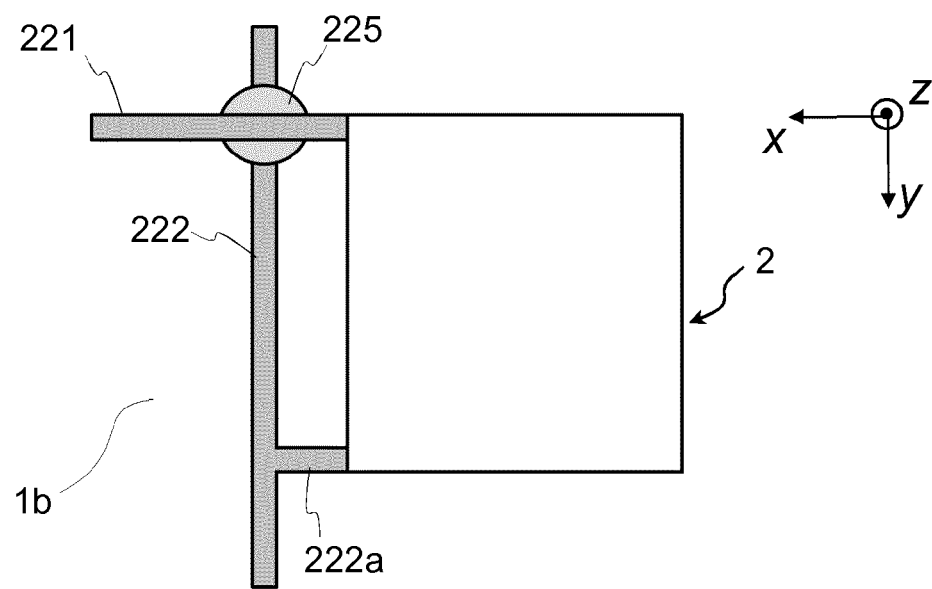
FIG. 4 is a top view of an offset PCM pixel structure, showing connections to electrodes at a crosspoint, as involved in embodiments.

For example, the schematic passive matrix display of FIG. 3 involves row 221 and column 222 electrodes in a crosspoint configuration with the pixels 2 located about each crosspoint. For simplicity, pixels 2 are illustrated on each crosspoint in the diagram of FIG. 3. In practice, however, the pixels 2 may need be laterally offset (as illustrated in FIG. 4) from the crosspoints. Yet, more sophisticated, 3D structures can be devised, as discussed later in reference to FIGS. 7-8, to avoid offset configurations and increase the pixel fill-factor. In the system of FIG. 3, the row electrodes 221 are addressed by a multiplexer 31 and the column electrodes 222 by another multiplexer 32. The multiplexers are controlled by a microprocessor 36 while the timing and signals are handled by a function generator 34. All such electronic interface elements are well known in the art, e.g., they are standard features of a passive matrix display, which ease the interfacing of a PCM pixel display. Still, the function generator need be fed with or have access to suitable waveform definitions and its timing functions need be adapted to the timing involved in the present sequence of events, taking into account the response times of the RSEs 21, the heating elements 17 and PCMs 10.

In the example of FIG. 1, the RSE 21 is integrated in the pixel, i.e., the RSE is stacked in the layer structure 2 of the pixels. This approach simplifies the fabrication of the device 1 as the RSE merely requires an additional layer deposition when forming the stack. Note that the layer stack 2 sits on the electrodes 221, 222, with the RSE 21 bridging the electrodes, but the layer stack 2 is not sandwiched between the electrodes. That is, the RSE 21 is in series with the heater 17 and electrodes 221, 222, but the PCM is electrically separate from the current path. In that sense, the electrical path and the thermal/optical paths are de-correlated, which prevent electrodes to interfere with optical properties of the pixels.

Indeed, in usual crosspoint device structures, the active element is commonly fabricated at the crossing point, and sandwiched between the row and column electrodes. However, in the present context (a display), one may want to avoid a sandwich configuration and prevent electrodes to interfere with optical properties of the pixels. This can be simply resolved by laterally shifting the pixels, as evoked above. This is illustrated in FIG. 4. Here, each pixel 2 is laterally offset (i.e., in a direction perpendicular to the stacking direction z of the layer structure) from the crosspoint formed at the intersection of electrodes 221, 222. Still, the electrodes 221, 222 are in electrical communication with the RSE (not visible in FIG. 4) of the depicted pixel 2. For example, an edge of the pixel 2 may be parallel and at a distance from one 222 of the electrodes and be contacted by an auxiliary arm 222a, forming a junction with the electrode portion 222. Another, contiguous edge of the same pixel 2 may thus be in direct contact with the other electrode 221.

As a result of positioning the pixel away from the crosspoint, it is necessary to insulate the crossing point of the row and column electrodes, e.g., using a dielectric element or bridge 225. Insulation may, however, already be provided by a layer in which the electrodes are embedded.

For example, the bridge 225 can be fabricated from a polymer material that is first lithographically fabricated over the column electrodes 222 at each crosspoint, e.g., in the form of a disc shape. The polymer disc is then heated past the glass transition temperature such that each disc forms a lenticular shape, which is then cooled. The fabrication of the row electrodes 221 over the column electrodes 222 and the bridge layer 225 then takes place, with the lenticular shape of the bridge 225 guiding the row electrodes 221 over each crosspoint while minimising sharp gradients, which could else lead to increased resistance or failures. In variants, the bridge can be fabricated as an oxide or nitride (e.g., $Si_3N_4$), deposited through a mask.

While not allowing the highest density of pixels, the offset configuration of FIG. 4 is quite adequate for many display applications and will typically cover 70% or more of the active area. A black matrix may for instance be used to cover remaining areas (other than pixel areas), including electrodes 221, 22 and dielectric bridges 225.

In variants, more sophisticated structure can be contemplated, which allow larger pixel filling, as discussed now in reference to FIGS. 7-10. One key aspect of such embodiments is to connect electrodes 221, 222 to heating elements of the pixels through transverse vias. Namely, and as seen in FIGS. 7-10, each pair of electrodes can be made in electrical communication with a heating element 17c, 17d of a pixel 2c, 2d through two transverse vias 41, 42, which extend, each, parallel to the stacking direction z of the layer structure.

Of particular advantage is to configure one 41 or each of said vias 41, 42 as a nonlinear resistive element. Having one of the vias 41, 42 configured as a RSE should normally suffice for the present purpose. However, having both vias 41, 42 configured as a RSE allows the thickness of the RSEs to be reduced. E.g., since both vias are in series with the heater, having two half thickness vias 41, 42 should in principle lead to the same performance as a full thickness via.

In FIGS. 7-10, the vias 41 comprise a nonlinear resistive material such as used in the RSEs 21 discussed earlier (effectively the vias 41 are RSEs). The vias 41 are otherwise in electrical communication with the heating elements 17c, 17d. Such a design allows 3D structures, which make it possible to increase the surface available for a pixel. That is, the layer structure 2c, 2d may now span an optimal surface, e.g., corresponding substantially to the cell area available for each crosspoint, contrary to the more planar structure of FIG. 4 where pixels are laterally offset. Thus, the relative surface effective filled by the pixels, or fill-factor, can be increased.

Figure 7:
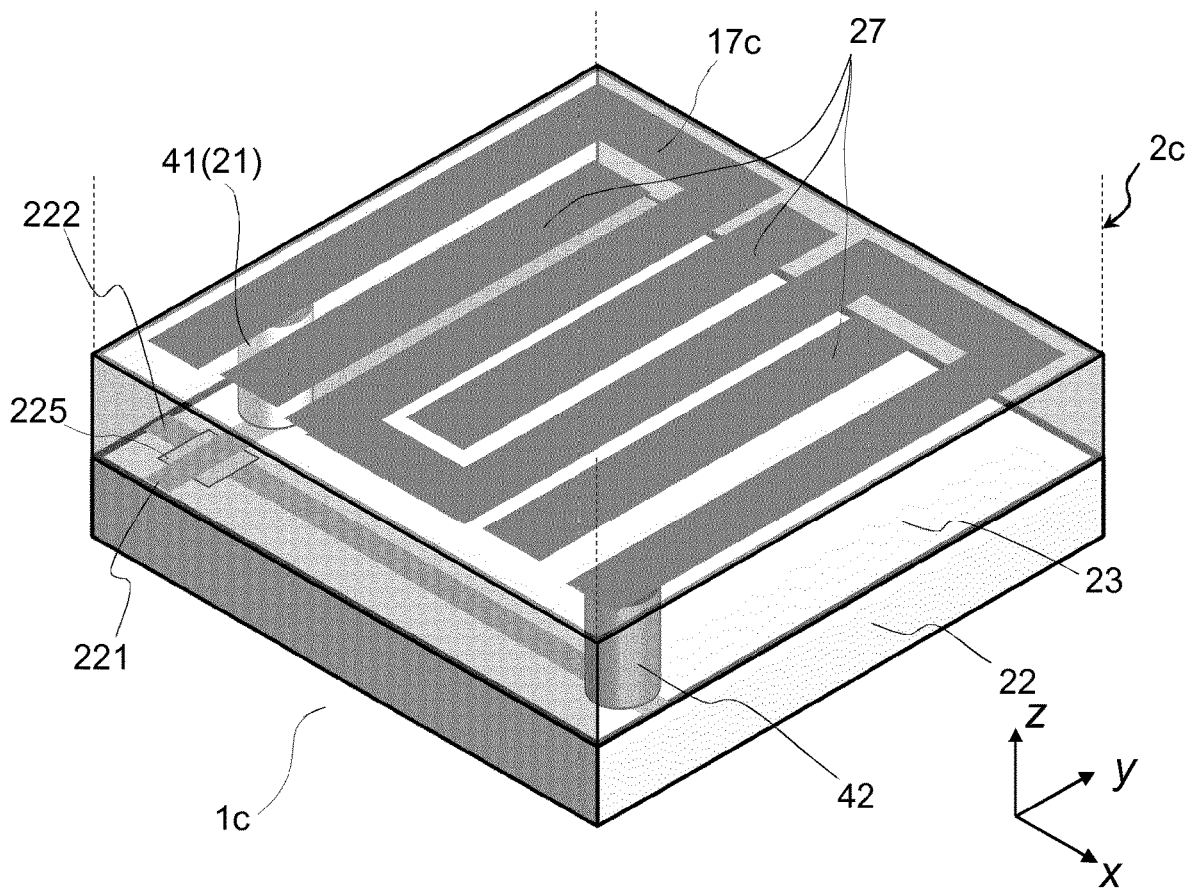
FIG. 7 is a 3D (partial) view of a PCM pixel connected to crosspoint electrodes via transverse vias, according to embodiments.
Figure 8:
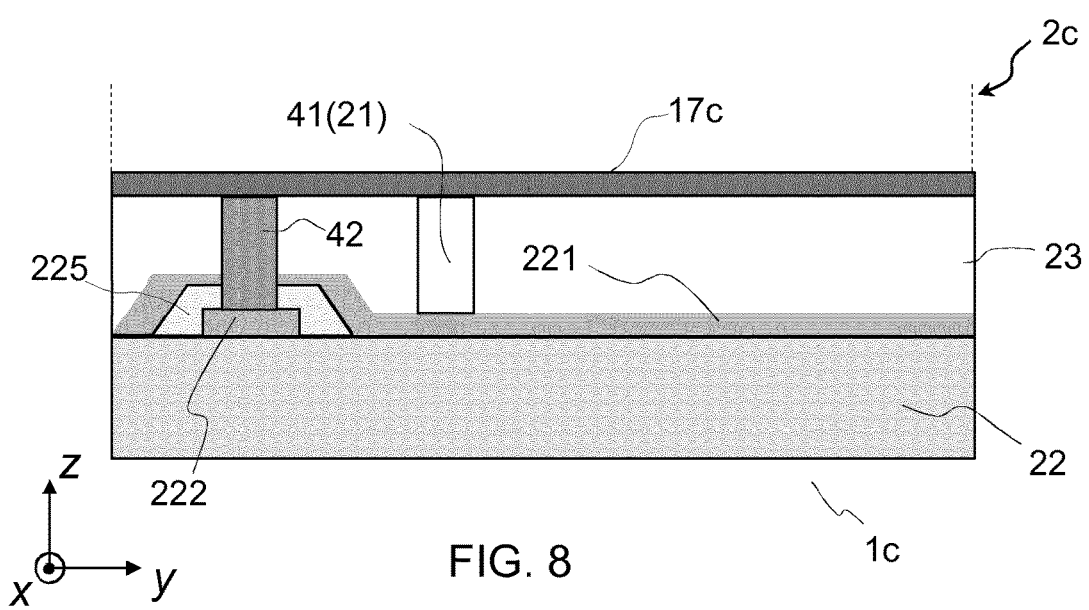
FIG. 8 shows a side view of the PCM pixel of FIG. 7.

Referring now more particularly to FIGS. 7, 8: each pair of vias 41, 42 may, in embodiments, be both located between the electrodes 221, 222 and the heating elements 17c. Note that remaining layers of the stack 2c are not depicted in FIGS. 7-8, for clarity. In addition, only the infrastructure corresponding to one pixel of the device 1c is depicted here.

In more detail, each pair of vias 41, 42 may be provided in a space between the average plane of the electrodes 221, 222 and the average plane of the heating elements 17c. In this case, the vias 41, 42 are all on a same side of the heater elements. Typically, the vias 41, 42 are embedded in a layer 23 and the electrodes 221, 222 are patterned onto a substrate 22.

The design used in FIGS. 7, 8 allows the fill-factor to be increased, while it remains of relatively simple fabrication. Such a solution allows a matrix addressed array 1c of PCM-based pixels to be obtained, wherein the row and column electrodes 221, 222, the nonlinear and passive interconnection elements 41, 42 sit below the heater elements 17c.

Of particular advantage is to configure the heating elements 17c as optical reflectors, which would hence act as mirror elements of the optical stacks. Yet, the heating elements 17c may need be made narrow, for efficient heating. In that case, the heating elements may have a serpentine design. Complementary mirror parts 27 may furthermore fill the remaining areas, to improve optical reflection of the mirror layer.

Figure 9:
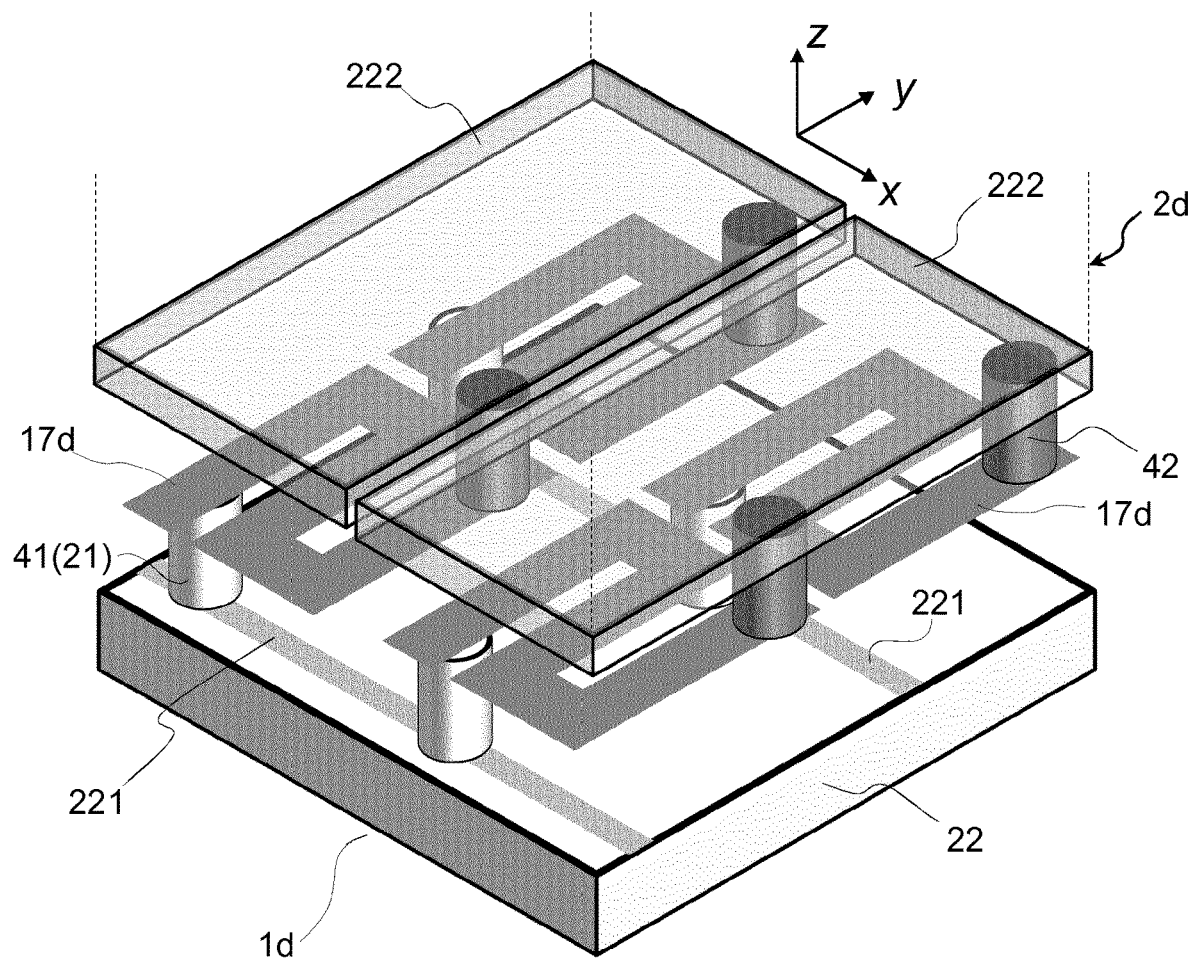
FIG. 9 is a 3D (partial) view of a variant to FIGS. 7 and 8 and FIG. 10 is a corresponding side view.
Figure 10:
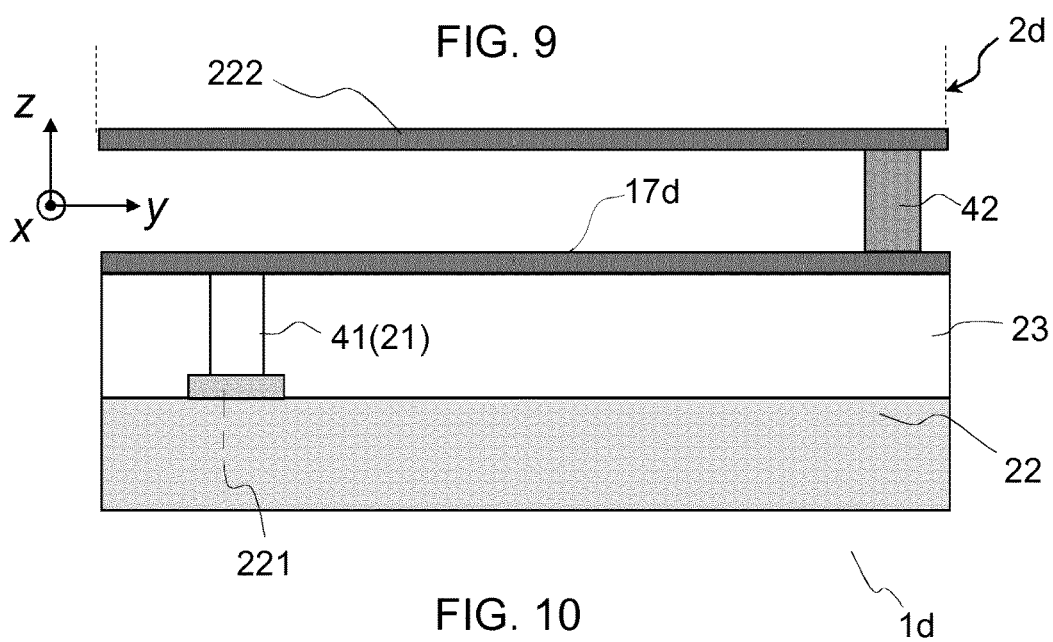

Referring now to FIGS. 9, 10, the display device 1d may be designed so as for electrodes 221, 222 to extend on either side of the plane of the heaters 17d. In FIGS. 9, 10, the infrastructure represented corresponds to four pixels; the upper layers of the stacks 2d are not depicted, for clarity.

In detail, row electrodes 221 extend in a first plane on one side of (i.e., below) the average plane of the heating elements 17d (at the bottom of the stack 2d, not depicted), while column electrodes 222 extend in a second plane on another side of (i.e., above) the heating elements 17d. The vias 41, which comprise a nonlinear material 21, connect electrodes 221 to respective heating elements 17d. The other vias 42 connect the heating elements 17d to column electrodes 222 on top. The latter will advantageously be configured as mirrors. This saves having to use a block of insulator to separate the row and column electrodes 221, 222 (though the latter may well be embedded in a layer 23, not shown in FIG. 9). All the more, this approach allows the electrodes 222 on top to double as mirrors. This, in turn, allows the heater 17d to be small and non-reflective, whose material properties can instead be tuned for higher resistance.

Be it in embodiments as in FIG. 1 or 9-10, providing the heating element 17, 17c, 17d opposite to the PCM 10 with respect to the optical reflector 15, 222 can be advantageous, provided the optical reflector is sufficiently thermally conducting. For instance, referring back to FIG. 1, the display device 1 may have a layer structure 2 that comprises an optical reflector 15 and a spacer 14, in addition to the RSE 21, the heating element 17 and the PCM 10 already described earlier.

The reflector 15 and the spacer 14 are both thermally conducting. The spacer 14 is transmissive to light and arranged above the reflector 15. The spacer may for instance comprise one or more layers of materials, each of which is either sufficiently thin or transparent for the spacer layer overall to be substantially transmissive to light. The PCM 10 is arranged above the spacer 14. Remarkably, the heating element 17 is located opposite to the PCM 10 with respect to the reflector 15, i.e., on the other side of the reflector 15, and thus is not in direct contact with the PCM. Still, as per the above configuration, the heating element 17 is in thermal communication with the PCM 10 via the reflector 15 and the spacer 14. However, the PCM 10 is electrically insulated from the heating element 17. An additional electrically insulating but thermally conducting layer 18 may be provided to that aim. In variants, the reflector may be designed as a dielectric mirror, or as a diffuse optical reflector. The heating element is preferably provided as a layer, thereby completing the stack of layers 10, 14, 15. I.e., the heating element 17, the reflector 15, the spacer 14 and the PCM 10 are stacked as layers along the stacking direction z of the layer structure 2. The various elements 17, 15, 14 and 10 form a properly ordered sequence in the structure 2. Yet, such elements are not necessarily immediately consecutive. I.e., the sequence may comprise one or more additional layers inserted in the sequence, such as, e.g., layer 18. Yet, any additional layer should have suitable physical properties so as to maintain the desired thermal path and electrical barrier between the heater 17 and PCM 10.

The layers 10-17 preferably all have the same lateral dimensions x, y (perpendicularly to the stacking direction z). The structure 2 may have substantially constant lateral dimensions along z, so as to form a compact, protruding structure, and thus favour uniform heat propagation between the heater 17 and the PCM 10, along z. This, in turn, helps to achieve a uniform switching and optimize power consumption. However, it not critical to have substantially identical lateral dimensions in the layer stack, as long as heat can be satisfactorily transferred to the PCM along z.

In particular, the lateral dimensions of the heating element 17 may essentially match those of the upper elements 10-15, or even be slightly larger, so as to favour heat transfer. The thicknesses of the various elements 17, 15, 14 can furthermore be chosen so as to optimize thermal properties. More generally, the device 1 can be designed so as to favour a uniform switching, over a large portion of the PCM 10 or, if possible over a major portion thereof.

Advantageously, the location of the heater 17 in the stack does not perturb the ordered sequence of layers 10-14-15, which can, in turn, be optimized in terms of their optical properties. This allows the spacer thickness to be adjusted, e.g., for each pixel or subpixel, so as to leverage interference effects that depend on the refractive index of the PCM 10 and the thickness of the spacer 14. Thus, there is no need to use colour filters, though such filters may be used, complementarily to the spacers, if needed. Moreover, the device may include optical attenuators or electro-optical attenuators or, still, any filter configured to obtain a desired display shade.

In addition, the heating element 17 need not be made transmissive to light, as it would if it were in direct contact with the PCM, i.e., above the reflector. It can instead be optimized in respect of its desired electrical/thermal properties (e.g., a high resistance). The heater 17 is connected in series between low resistivity electrodes 221, 222, below the reflector 15, to optimize power conversion while energizing the pixel and minimize power consumption. This further simplifies the overall structure, inasmuch as the sole electrical contacts are on the backside of the structure 2, without electrodes sandwiching the active optical regions being needed.

Thanks to the present layer architecture, subpixels can more easily be fabricated (and electrically addressed), each capable of providing a different colour. The heater 17 is preferably chosen so as to be actuated using standard CMOS technology. Subpixels may have spacers of substantially distinct thicknesses to provide for different colours. In passive display applications, the heater 17 is preferably chosen so as to have high resistance compared to its respective column and row lines, to make sure that the majority of the voltages applied from the controller will efficiently drop across the heater. However, the heater should preferably not be too resistive, to avoid the need of too high voltage to reach high enough temperatures.

Note that the layers 10-17 need not necessarily be perfectly plane; they might instead be structured, although they will generally be stacked along stacking direction z. In particular, the heater 17 may be structured to improve the temperature profile therethrough and, thus, the switching.

Typically, a transparent capping layer 16 is arranged on top of the PCM 10, a surface 16s of which defines the viewing surface, as seen in FIG. 1.

A minimal degree of transparency is desired for layers 16, 10 and 14. At least 10% transmittance of incident light is typically needed. For the PCM layer, a minimum of 1% is typically needed. Exact values of transmittance depend on the actual thicknesses of the layers. The reflector 15 need typically be optically thick. E.g., if the reflector layer 15 may be essentially made of silver and have a thickness of at least 60 nm and, preferably, of at least 100 nm is needed. The reflector preferably has a reflectance of more than 80%, 90% or even 95%, on average, over the range of wavelengths of interest.

Having the heating element 17 opposite to the PCM 10 with respect to the reflector 15 allows, in practice, larger surfaces of PCMs to be switched. A similar structure can also be adopted in the context of FIGS. 7-10, in variants where the heaters 17c, 17d are not used as mirrors.

In order to concurrently optimize the thermo-optical properties of the display devices, one may further impose the average thickness of the reflector 15 to be between 50 nm and 1 μm. Meanwhile, the average thickness of the spacer 14 would typically be between 10 nm and 250 nm and the average thickness of the PCM 10 between 1 nm and 100 nm, and preferably between 7 nm and 15 nm. The thickness of the PCM may for instance be between 3 nm and 10 nm, e.g., be of 6 or 7 nm, especially where GST is used. Such dimensions were found to favour uniform switching of the PCM, especially where GST is used. On the contrary, lateral dimensions are not specifically limited (but are typically more than 0.5 nm). The maximal, lateral dimension of the layer structure depends on the type of display contemplated, architecture and materials used.

Figure 5:
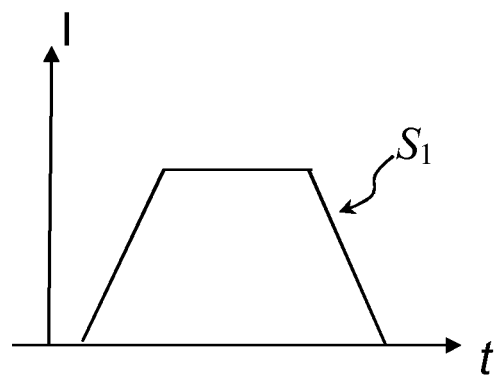
FIGS. 5 and 6 are schematic plots of current intensity profiles for PCM switching from an amorphous state to a crystalline state and vice-versa.

An example of operation of the display is now discussed in reference to FIGS. 2 and 3. In this example, as a starting point, each of the nine pixels in the schematic array of FIG. 3 is in the OFF state, with the RSE for each pixel in a high resistance state. Assume that one pixel is to be switched on in a next step. In the case of a black and white display, the ON state might correspond to a bright, white level. In order to switch the pixel ON, a signal (hereafter assumed to be a voltage, although a waveform or current pulse may also be used) is applied between the row electrode 221 and the column electrode 222 pertaining to this pixel. The voltage $V_3$ applied need be in excess of the transition voltage $V_2$. In practice, this can be arranged well within the normal voltage range of a CMOS circuitry. As the RSE reaches a low-resistance state R (it is switched ON), it generates, under the signal $V_3$ applied by the controller 30, a current pulse with a specific profile over time (FIG. 6), which reaches the heater 17 associated with the pixel of interest, such that the PCM pixel undergoes a rapid phase change from a crystalline to an amorphous state. When the applied signal ceases, the PCM 10 stays ON, whereas the corresponding RSE returns to a high-resistance state. Meanwhile, the remaining pixels (which have not been addressed so far) remain OFF. Only a very small, residual leakage current may flow to the heater elements of the pixels, as their respective RSEs, now all OFF, filters out parasitic signals. In order to switch the (currently ON) PCM pixel back from the amorphous to crystalline state, a second signal, yielding a different current profile (FIG. 5) can be applied from the controller 30. This sets a black state for the pixel. In practice it is possible to address one or more pixels in parallel using the controller 30 and multiplexer circuitry techniques 31, 32.

The signals applied from the controller 30 cause signals $S_1$, $S_2$ to be generated in output from the RSE, which output signals have pulse characteristics (amplitude and duration) that determine the heat profiles in the heater 17, 17c, 17d and, in turn, the heat transferred to the PCM 10. For example, a signal $S_1$ with first characteristics is provided to the heater while the PCM is in an amorphous state, to set the PCM to a crystalline state. For example, the applied signal $S_1$ causes to generate a first temperature profile $P_1$ in the PCM (from the heating element). In response to the application of the first signal to the heater, the latter generates heat that is conducted to the PCM to induce a temperature $T_1$ greater than the crystallization temperature T, but less than the melting temperature $T_m$, and which remains greater than T for a time sufficient to crystallize the PCM.

Figure 6:
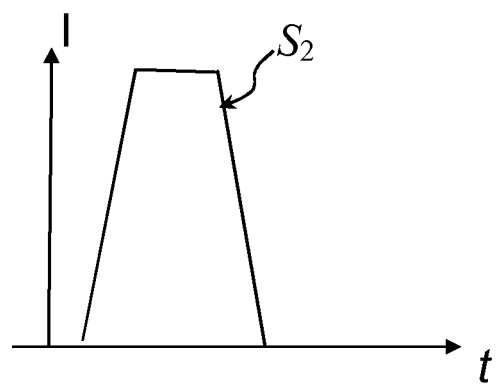

Similarly, under application of a suited signal by the controller, a second signal $S_2$ with second characteristics can be generated in output of the RSE, while the PCM is still in a crystalline state, as illustrated in FIG. 6. This, in turn, generates a second heat profile $P_2$ in the PCM, which sets the PCM back to an amorphous state. Here, in response to the second signal, the resistive heater element 17 generates a second heat profile, whereby heat is conducted to the PCM. This results, in the PCM, in a temperature $T_2$ that is now greater than the melting temperature $T_m$, and induces a transition to a liquid phase. Allowing the temperature to rapidly decay after the falling-edge of the applied pulse results in solidification of PCM in the amorphous state. Note that the heater-temperature profiles $T_1$, $T_2$ generated by the heater have substantially the same shape as the current intensity profiles $S_1$, $S_2$ obtained in out of the RSE.

The pulses applied from the controller can be adjusted and refined, e.g., by trial and error, and based on all the relevant parameters, starting with the nature of the materials 17, 18, 15, 14, 10 and their dimensions. In that respect, the materials 21, 17, 18, 15, 14, 10, 16 may be selected and designed (e.g., in terms of thickness) so as to have thermal, optical and/or electrical properties that ensure rapid dissipation of the heat from the PCM 10, be it to mitigate the recrystallization of the PCM subsequent to melting (during the amorphisation process).

In the example of FIG. 3, all the pixels in the array can be independently addressed by a sequential application of signals between each combination of row (221) and column (222) electrodes. This may be achieved by applying a row selection signal (e.g., a voltage of a given polarity and magnitude which is itself not sufficient to activate the RSE, that is, smaller than $V_2$) to each row electrode. While this signal is in effect for each row, an addressing signal of opposite polarity (with magnitude and duration to either crystallise, re-amorphise or leave unchanged the PCM region at each intersection of the currently active row) is applied to each column electrode simultaneously. The signal of opposite polarity to the row selection signal may then cause the total voltage, in combination with the row selection voltage, across the heater and RSE element of the intended pixels in the row, to exceed $V_2$ and result in the intended current pulse. In this manner, each row of the array may be addressed in a given time period, and all rows may be addressed sequentially within the allotted frame time to update the full image on the display.

Such row-wise addressing is a standard method in display driving. Other, more complex passive matrix addressing schemes are also well known, which use orthogonal waveforms applied to the rows as activation signals, allowing multiple rows within the array to be activated at the same time while maintaining independence of the switching signal resulting on each intersection. Such "matrix drive" or "parallel drive" schemes may also be applied to PCM-based displays according to embodiments.

Conversely, rows may be addressed in a non-sequential order, and rows may be addressed more than once in a given frame period, with a portion of the pixels in each row addressed during activating period, so as to spatially separate pixels which are activated simultaneously or during temporally close periods. This may allow more effective heat dissipation from individual pixels and prevent a local build-up of heat from pixels being activated in close spatial and temporal succession, which may interfere with successful re-amorphisation of the pixels.

More generally, methods for controlling display devices 1, 1a-d as disclosed herein comprise repeatedly energizing the pixels, via the controller 30, so as to reversibly switch RSEs 21 in electrical communication with respective heating elements of the pixels and energize the respective heating elements 17, 17c, 17d. This, as discussed earlier, allows the refractive index of respective PCMs 10 to be reversibly changed.

The devices described above can, in general, be used in the fabrication of displays and (sub)pixels in display devices. The resulting devices can be distributed by the fabricator in raw form (that is, as a single product that has multiple unpackaged devices) or in a packaged form. In any case the device can then be integrated with other devices, discrete circuit elements, and/or other signal processing devices as part of either (a) an intermediate product or (b) an end product. The end product can be any product that includes an optical device such as described above, ranging from low-end applications to advanced products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials or thickness than those explicitly mentioned may be contemplated.

The invention claimed is:

1. A display device comprising:
a set of pixels, each having a layer structure that includes:
   a bi-stable, phase change material, or bi-stable PCM, having at least two reversibly switchable states, in which the PCM exhibits two different values of refractive index and/or optical absorption; and
   a heating element, electrically insulated from the PCM and in thermal communication with the PCM in the layer structure;

and wherein the display device further comprises:
   a set of nonlinear, monostable resistive switching elements, each in electrical communication with the heating element of one of the pixels, and designed so as to exhibit:
      a low resistance, unstable state, which allows the heating element to be energized via the resistive switching element, so as to heat the PCM and reversibly change a refractive index and/or an optical absorption thereof, in operation; and
      and a high-resistance, stable state, which allows leakage currents to be mitigated, so as to prevent inadvertent switching of the PCM from one of its states to the other, in operation; and
   a controller configured to energize any of the pixels via a respective one of the resistive switching elements, so as to switch the latter from its high-resistance state to its low resistance state, in order to energize a respective heating element and, in turn, reversibly change a refractive index and/or an optical absorption of a respective PCM.

2. The display device according to claim 1, wherein:
the device is a passive matrix addressing display, which further comprises an arrangement of pairs of electrodes, each of the pairs of electrodes being in electrical communication with a heating element of one of the pixels, via a respective one of the resistive switching elements that is connected in series between the electrodes of said each of the pairs, so as for each of the pixels to be individually addressable by the controller in the display device.

3. The display device according to claim 2, wherein:
each of the pixels comprises said respective one of the resistive switching elements, the latter stacked in the layer structure of said each of the pixels.

4. The display device according to claim 3, wherein:
said arrangement of pairs of electrodes forms a matrix, whereby first electrodes of the pairs of electrodes are arranged in columns and second electrodes of the pairs of electrodes are arranged in rows; and
each of the pixels is offset, in a direction perpendicular to a stacking direction (z) of the layer structure of said each of the pixel, from a crosspoint formed at an intersection of one of the first electrodes with one of the second electrodes, said one of the first electrodes and said one of the second electrodes being in electrical communication with the resistive switching element of said each of the pixels.

5. The display device according to claim 2, wherein:
each of the pairs of electrodes is in electrical communication with the heating element of one of the pixels through two vias extending, each, parallel to a stacking direction (z) of the layer structure of said one of the pixel, wherein one of said vias comprises the resistive switching elements that is in electrical communication with the heating element of said one of the pixels.

6. The display device according to claim 5, wherein:
said two vias both extend between an average plane of said arrangement of pairs of electrodes and an average plane of the heating element of said one of the pixels, said heating element being preferably configured as an optical reflector.

7. The display device according to claim 5, wherein:
first electrodes of the pairs of electrodes extend in a first plane on one side of an average plane of the heating element of said one of the pixels, and second electrodes of the pairs of electrodes extend in a second plane on another side of said average plane of the heating element, said second electrodes being preferably configured as optical reflectors, and wherein, one of said two vias is connected to one of said first electrodes, the other one of said two vias being connected to one of the second electrodes.

8. The display device according to claim 1, wherein the layer structure further comprises:

a thermally conducting, optical reflector;

a thermally conducting spacer, which is transmissive to light and arranged above the reflector, wherein, the PCM is arranged above the spacer, so as for the reflector, the spacer and the PCM to be successively stacked along a stacking direction (z) of the layer structure, and the heating element is opposite to the PCM with respect to the reflector, the layer structure being configured so as for the heating element to be in thermal communication with the PCM via the reflector and the spacer.

9. The display device according to claim 8, wherein:

an average thickness of the reflector is between 50 nm and 1 µm;

an average thickness of the spacer is between 10 nm and 250 nm; and an average thickness of the PCM is between 0.5 nm and 500 nm, and preferably between 1 nm and 100 nm, and more preferably between 7 nm and 15 nm.

10. The display device according to claim 1, wherein:

an average thickness of the heating element is between 20 nm and 2 µm, and preferably between 60 nm and 140 nm; and an average thickness of the resistive switching element is between 10 nm and 100 nm, and preferably between 10 nm and 30 nm.

11. A display device according to claim 1, wherein:

each of the resistive switching elements is a threshold switching device, and preferably is one of: an ovonic threshold switch; a metal-insulator transition device; a diode; and a threshold vacuum switch.

12. A display device according to claim 1, wherein:

each of the resistive switching elements comprises a material that is one of: an oxide; a nitride; a sulfide; an oxynitride; and diamond, said resistive switching element preferably comprising one or more materials that comprise, each, one or more of: $NbO_x$, $VO_x$, $HfO_2$, $SiO_2$, $ZrO_2$, and $TiO_2$.

13. A display device according to claim 1, wherein the PCM comprises one or more of the following compounds: GeSbTe, $VO_x$, $NbO_x$, GeTe, GeSb, GaSb, AgInSbTe, InSb, InSbTe, InSe, SbTe, TeGeSbS, AgSbSe, SbSe, GeSbMnSn, AgSbTe, AuSbTe, and AlSb.

14. A display device according to claim 1, wherein the heating element of each of the pixels comprises one or more of the following: NiCrSi, NiCr, W, TiW, Pt, Ta, Mo, Nb and Ir.

15. A method for controlling a display device according to claim 1, the method comprising:

repeatedly energizing the pixels, via the controller, so as to reversibly switch resistive switching elements in electrical communication with respective heating elements of the pixels and energize the respective heating elements to reversibly change a refractive index and/or an optical absorption of respective PCMs of the pixels.

* * * * *